United States Patent
Lin et al.

(10) Patent No.: US 11,441,943 B2
(45) Date of Patent: Sep. 13, 2022

(54) PROXIMITY SENSING DEVICE

(71) Applicant: Luxsentek Microelectronics Corp., New Taipei (TW)

(72) Inventors: Chih-Wei Lin, New Taipei (TW); Chen-Hua Hsi, New Taipei (TW)

(73) Assignee: LUXSENTEK MICROELECTRONICS CORP., New Taipei (TW)

( * ) Notice: Subject to any disclaimer, the term of this patent is extended or adjusted under 35 U.S.C. 154(b) by 93 days.

(21) Appl. No.: 17/168,731

(22) Filed: Feb. 5, 2021

(65) Prior Publication Data

US 2022/0163386 A1 May 26, 2022

(30) Foreign Application Priority Data

Nov. 26, 2020 (TW) .................................. 109141490

(51) Int. Cl.
| | |
|---|---|
| *H05B 45/10* | (2020.01) |
| *G01J 1/44* | (2006.01) |
| *H05B 45/30* | (2020.01) |
| *G01J 1/42* | (2006.01) |
| *H03K 17/94* | (2006.01) |
| *H03K 17/945* | (2006.01) |
| *H03M 1/10* | (2006.01) |

(52) U.S. Cl.
CPC ............... *G01J 1/44* (2013.01); *G01J 1/4204* (2013.01); *H03K 17/941* (2013.01); *H03K 17/945* (2013.01); *H03M 1/1009* (2013.01); *H05B 45/10* (2020.01); *H05B 45/30* (2020.01); *G01J 2001/444* (2013.01); *H03K 2217/94108* (2013.01)

(58) Field of Classification Search
CPC ...... G01J 1/44; G01J 1/4204; G01J 2001/444; H03K 17/941; H03K 17/945; H03K 2217/94108; H03K 2217/94026; H03K 2217/94031; H03M 1/1009; H05B 45/10; H05B 45/30
See application file for complete search history.

(56) References Cited

U.S. PATENT DOCUMENTS 10,813,196 B1 * 10/2020 Stubbs .................. H05B 47/11

* cited by examiner

*Primary Examiner* — Minh D A
(74) *Attorney, Agent, or Firm* — Muncy, Geissler, Olds & Lowe, P.C.

(57) ABSTRACT

The present invention provides a proximity sensing device, which comprises an ambient light calibration digital-to-analog converter and at least one crosstalk calibration digital-to-analog converters. The proximity sensing device is able to quickly generate calibration parameters for the interference caused by the ambient list and crosstalk caused by different reflection, to calibrate the sensed signals to avoid wrong judgments.

8 Claims, 3 Drawing Sheets

PROXIMITY SENSING DEVICE

BACKGROUND OF THE INVENTION

1. Field of the Invention

The present invention relates to a proximity sensing device, in particular relates to eliminate the interference of the ambient light and the crosstalk due to sunlight injection and the reflection of the cover glass.

2. Description of the Prior Art

Smart electronic devices are usually able to sense and react the ambient light or user behavior. For example, the mobile phone adjusts the screen brightness to variation of ambient light or turns off the screen when mobile phone is near the ear. For another example, the headset plays the audio when being put into the ear, and it switches off the communication when removing from the ear to save power consumption.

Proximity sensing devices are configured to sense objects in the proximity of the device. The proximity sensing device basically has at least one light emitting diode (LED), one light sensor (such as a photodiode, PD), and a micro-control unit (MCU). The LED emits a detection light on an object approaching the device. The PD receives the detecting light reflected by the object and converts into an electrical signal. The MCU calculates the distance between the object and the device.

However, except for the reflection of the object, the proximity sensing device also receives the ambient light and the reflection from another objects, like reflection from the cover glass surface or the dirt on the outer casing of the device, i.e. crosstalk effect, and that affects the measurement accuracy. The reflection of the cover is calibrated when packaging the proximity sensing device. The interference from the ambient light variation and the crosstalk from the reflection from the dirt or the protective film on the cover glass must be eliminated when activating.

There are known ways to eliminate the reflection crosstalk but none to eliminate the interference of ambient light. In addition, high accuracy and fast response are required for the new generation of electronic products. The invention proposes a calibration skill for those requirements.

SUMMARY OF THE INVENTION

The present invention provides a proximity sensing device, comprising:
a control module;
a light-emitting module comprises a light-emitting element and a driver, the driver is coupled to the light-emitting element and the control module, the driver is driven by the control module to drive the light-emitting element to emit a detection light;
a light receiving module configured to receive and covert an external light to a light sensing signal;
an analog front-end module (AFE) coupled to the light receiving module through a first switch unit (SW1) to receive and convert the light sensing signal to an analog signal;
an analog-to-digital converter (ADC) coupled to the analog front-end module and the control module through a fifth switch unit (SW5) to receive and convert the analog signal to an operation signal to the control module;
a one cycle clock base analog-to-digital converter coupled to the analog front-end module and the control module through a sixth switching unit (SW6) to receive and convert the analog signal to a calibration signal to the control module; and
an ambient light calibration digital-to-analog converter coupled to the light receiving module and the control module through a second switch unit (SW2), wherein
the control module controls the first switch unit, the second switch unit, the fifth switch unit and the sixth switch unit to switch to close or open;
the proximity sensing device enters an operation mode when the fifth switch unit is switched to close and the sixth switch unit is switched to open; and
the proximity sensing device enters a calibration mode when the fifth switch unit is switched to open and the sixth switch unit is switched to close.

The present invention uses a crosstalk calibration digital-to-analog converter to perform a coarse tune and a fine tune on the crosstalk signal.

The present invention further comprises a first crosstalk calibration digital-to-analog converter and a second crosstalk calibration digital-to-analog converter respectively as a coarse tune and a fine tune of the crosstalk signal.

Below, embodiments accompanied with the attached drawings are employed to explain the objectives, technical contents, characteristics and accomplishments of the present invention.

DESCRIPTION OF THE PREFERRED EMBODIMENTS

Figure 1:
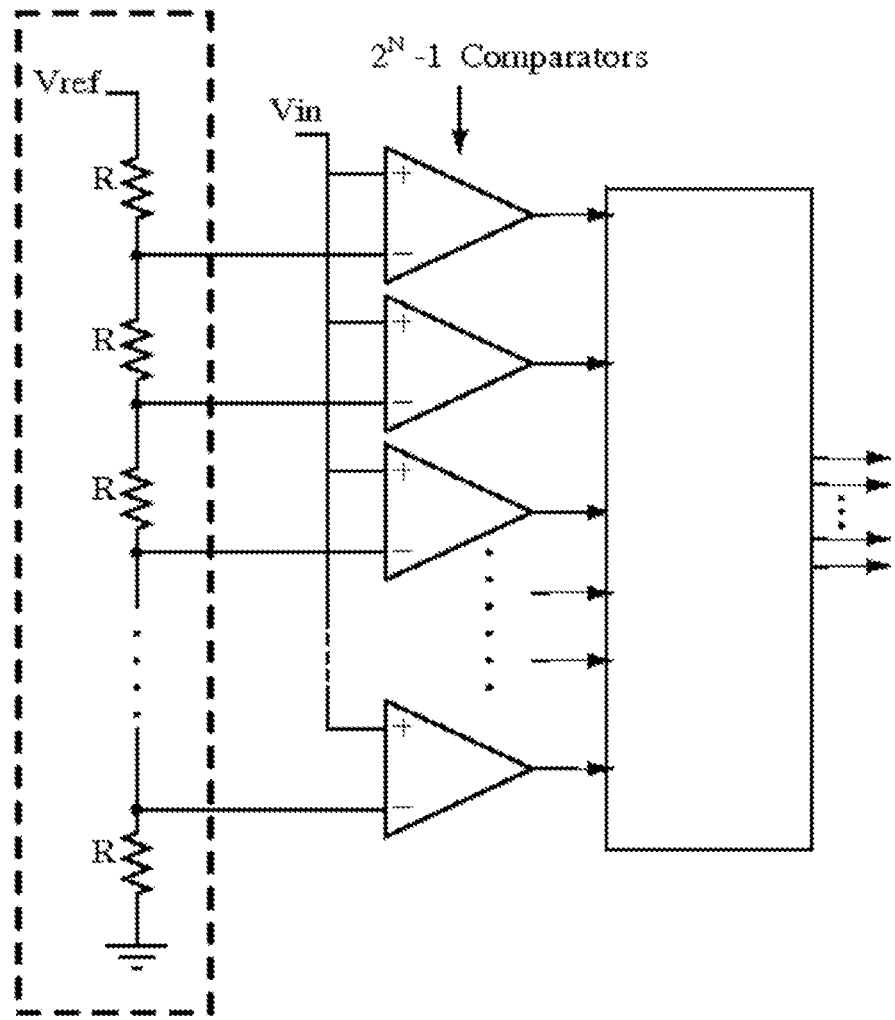
FIG. 1 is a logic circuit diagram of a one cycle clock base analog-to-digital converter according to an embodiment of the present invention.

Below embodiments accompanied with drawings are used to explain the spirit of this invention to have better understanding for the person in this art, not used to limit the scope of this invention, which is defined by the claims of this patent application. The applicant emphasizes the element quantity and size are schematic only. Moreover, some parts might be omitted to skeletally represent this invention for conciseness.

An electronic device first enters the calibration mode and then the operation mode when being activated. The proximity sensing device of the present invention cab be applied to the electronic devices, such as smart phones, tablet computers, or wireless earphones. The proximity sensing device can calibrate four types of interference sources as below:

(1) the crosstalk due to the reflection of the cover glass, which is calibrated before it leaves the factory.

(2) the crosstalk due to the reflection of the protective film on the device, which is calibrated automatically or manually when the electronic device is switched on.

(3) the crosstalk due to reflection of the grease on the cover glass, which is calibrated dynamically in using.

(4) the interference of ambient light, passing through the protective film and the upper cover glass and absorbed by the photodiode to affect or fail the sensor when being exposed under the environment, which needs to be re-calibrated if the ambient light varies.

A coarse calibration is used to eliminate the crosstalk types (1) and (2) is independent from using, and the calibration frequency is low. The coarse calibration can be complete in one clock cycle by using an analog-to-digital converter (ADC). A fine calibration is used to gradually eliminate the crosstalk type (3) and (4) which changes with the environment, and the calibration frequency is high. The fine calibration can be complete in some cycles. The present invention can eliminate the interference types (1)-(4), especially quickly eliminate the interference types (3) and (4) to avoid affecting the system operation.

The present invention discloses a circuit of coarse crosstalk cancellation to eliminate the signal offset due to the reflection of the glass cover and the protective film, and a circuit of fine crosstalk cancellation to eliminate the signal offset due to the reflection of the grease on the cover glass and the interference of the ambient light. In particular, the controller switches the circuits to achieve the function of eliminating crosstalk or interference.

The present invention uses a one cycle clock base analog-to-digital converter to speed up the conversion efficiency. A general ADC converts one bit in one cycle, the bit is "1" (HIGH) if the input voltage is higher than a reference voltage and "0" if the input voltage is lower than the reference voltage, and then the output voltage is used as the reference voltage for next cycle. After cycles, the analog signals are converted into a signal composed by these multiple bits (an N-bit calibration signal). However, the one cycle clock base analog-to-digital converter used in this invention, exemplary shown as FIG. 1, converts the to the N-bit calibration signal in one cycle. A 4-bit one cycle clock base analog-to-digital converter is used in one embodiment of this invention. It needs 4 cycles to compose a 4-bit calibration signal for general ADC but one cycle for the one cycle clock base analog-to-digital converter.

The embodiment shown as FIG. 1 briefly schematically represents the principle of the one cycle clock base analog-to-digital converter. A resistor series divide a reference voltage into multiple division, the divisional voltage is lower for the farer divisional resistor. An input voltage (Vin) compares with divisional voltages to make an N-bit calibration signal. Each bit corresponds to each comparison of the input voltage and the divisional reference voltage, the correspondent bit is "1" if input voltage is higher than the divisional voltage and "0" for lower case. Therefore, the conversion can be complete in one cycle.

Figure 2:
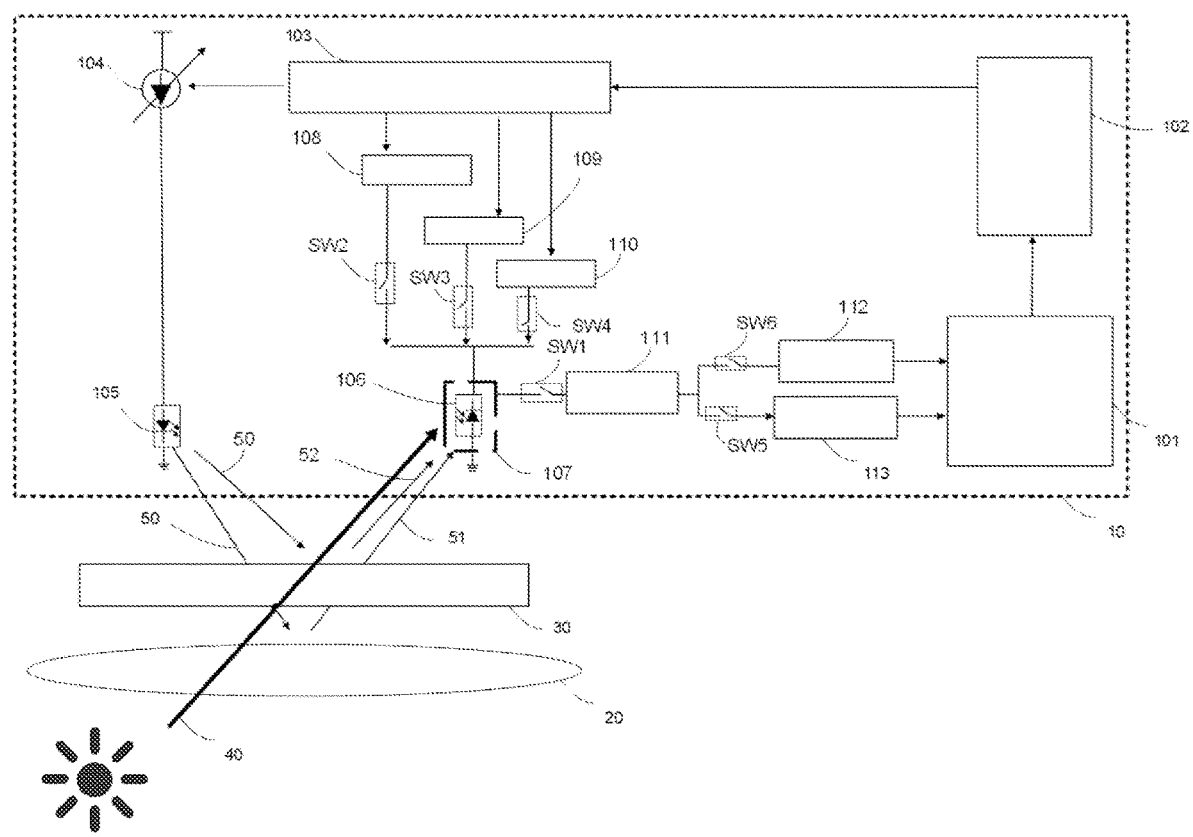
FIG. 2 is a logic circuit diagram of a proximity sensing device according to an embodiment of the present invention.

FIG. 2 schematically shows a logic circuit of a proximity sensing device according to an embodiment of the present invention.

The circuit of the proximity sensing device 10 of the present invention comprises a control module, a driver 104, a light-emitting element 105, a light receiving module 106, a color filter 107, an ambient light calibration digital-to-analog converter 108 (DAC), a first crosstalk calibration DAC 109, a second crosstalk calibration DAC 110, an analog front end module 111 (AFE), a one cycle clock base analog-to-digital converter 112, and a ADC 113. The control module comprises a microcontroller 101, a digital signal processor 102, and a timing controller 103.

The color filter 107 is optionally disposed around the light receiving module 106 to filter out crosstalk or interference due to the light with different colors. The light receiving module 106 connects to the AFE 111 through a first switch unit (SW1).

The AFE 111, comprising an integrator and a signal amplifier (not shown), outputs a sensing signal when sensing light. The AFE 111 respectively connects to the one cycle clock base ADC 112 through a sixth switch unit (SW6) and to the ADC 113 through a fifth switch unit (SW5).

The proximity sensing device 10 enters a calibration mode when the SW1 and the SW6 are switched to close but the SW5 is switched to open. In calibration mode, the one cycle clock base ADC 112 and the microcontroller 101 convert the sensing signal into a calibration N-bit signal in one cycle to speed up the generation of a calibration parameter.

The proximity sensing device 10 enters an operation mode when the SW1 and the SW5 are switched to close but the SW6 is switched to open. In operation mode, the ADC 113 and the microcontroller 101 are connected to output the sensing signal, which has been filtered out the crosstalk and interference from the sensing signal through the calibration parameter.

The microcontroller 101 can be configured to depend on the situation of the calibration mode, and switch to the operation mode once the calibration is complete. In the meantime, the microcontroller 101 generates and records the calibration parameter, and then generates a clock control signal of the timing controller 103 through the digital signal processor 102.

The timing controller 103 switches the SW1, SW2, SW3, SW4, SW5, SW6 and the driver 104 according to the clock control signal.

The ambient light calibration DAC 108 generates and transmits an ambient light calibration signal to the light receiving module 106 through the SW2.

The first crosstalk calibration ADC 109 generates and transmits a crosstalk coarse calibration signal (for example, generated by the cover glass 30 and the protective film) to the light receiving module 106 through the SW3.

The second crosstalk calibration DAC 110 generates and transmits a crosstalk fine calibration signal (for example, generated by grease on the cover glass 30) to the light receiving module 106 through the SW4.

The light-emitting element 105, such as a light-emitting diode (LED), an organic light-emitting diode (OLED) or infrared light (IR). The reflection light 51 of the detection light 50, emitted by the light-emitting element 105, is getting stronger when the external object 20 is closer. However, the crosstalk or interference does not change significantly with the distance of the object 20.

In the operation mode, the SW1 and the SW5 are switched to close but the SW6 is switched to open. The light receiving module 106 receives the sensing light, transmits the signal to the AFE 111, through the ADC 113, and to the microcontroller 101. The sensing light comprises the reflection light 51 from the object and the crosstalk signal, which includes the reflection light 52 from the cover glass, protective film and grease on the cover glass, and the ambient light 40 (such as sunlight) etc. The calibration signal is used to eliminate the crosstalk signal and keeps the reflection light 51 from the object. Finally, the microcontroller 101 transmits the calibrated signal to the electronic device through the digital signal processor 102. The calibration signal to the reflection light 51 is generated in the calibration mode.

In the calibration mode, the SW1 and the SW6 are switched to close but the SW5 is switched to open. The light receiving module 106 receives the sensing light, transmits the signal to the AFE 111, through the one cycle clock base ADC 112, and to the microcontroller 101.

It emphatically noted that to switch the SW2, the SW3 or/and the SW4 can obtain the calibration signals from different sources.

It can avoid crosstalk signals from the light-emitting element 105 when the driver 104 is off, and the ambient light is received by the light receiving module 106. In the meantime, for the ambient light, the ambient light calibration DAC 108 generates and transmits an ambient light analog signal ($V_{ambient\_DAC}$) to the light receiving module 106 when the SW2 is switched to close, but the SW3 and the SW4 are switched to open. The one cycle clock base ADC 112 converts the ambient light analog signal ($V_{ambient\_DAC}$) into an ambient light calibration digital signal and transmits it to the microcontroller 101.

When the driver 104 is on, the crosstalk light is received by the light receiving module 106. In the meantime, for the crosstalk light, the first crosstalk calibration DAC 109 generates and transmits a first crosstalk calibration analog signal ($V_{ICT\_DAC1}$) to the light receiving module 106 when the SW3 and the SW2 are switched to close. The one cycle clock base ADC 112 converts the first crosstalk calibration analog signal ($V_{ICT\_DAC1}$) to a coarse crosstalk calibration digital signal and transmits it to microcontroller 101.

When the driver 104 is on, the crosstalk light is received by the light receiving module 106. The second crosstalk calibration DAC 110 generates and transmits a second crosstalk calibration analog signal ($V_{ICT\_DAC2}$) to the light receiving module 106 when the SW4 and the SW2 are switched to close. The one cycle clock base ADC 112 converts the second crosstalk calibration analog signal ($V_{ICT\_DAC2}$) into a crosstalk fine calibration digital signal and transmits it to the microcontroller 101.

The ambient light calibration signal, the crosstalk coarse calibration signal and the crosstalk fine calibration signal by controlling the SW2, the SW3, the SW4 and the driver 104. These calibration signals are saved as calibration parameters in the microcontroller 101.

Obviously, the first crosstalk calibration DAC 109 and the second crosstalk calibration DAC 110 both are used to generate the crosstalk calibration signal caused by reflection. These two circuits can be integrated and the controller control the integrated circuit to generate the different crosstalk calibration signals. For example, the crosstalk calibration DAC generates the crosstalk coarse calibration signal in encapsulating the cover glass cover or replacing the protective film, and then it generates the crosstalk fine calibration signal for the grease on the cover glass.

The following explains the methods of generating different calibration parameters by using the timing diagram (half cycle on, half cycle off, or 50% duty PWM).

Figure 3:
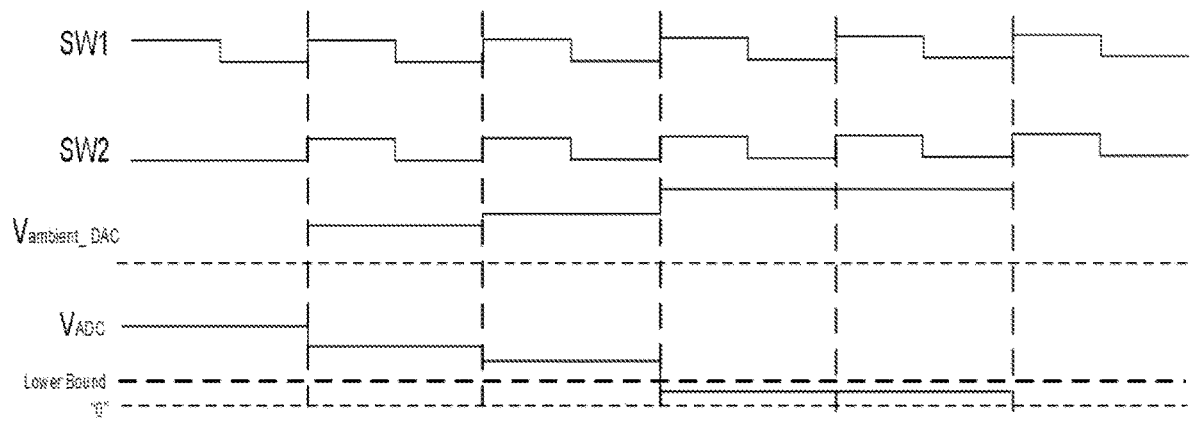
FIG. 3 is a timing diagram of the ambient light calibration data signal according to an embodiment of the present invention.

FIG. 3 shows the method to generate ambient light calibration signal. In calibration mode for generating the ambient light calibration parameter, the light emitting element 105 is off, and the light receiving module 106 only receives the ambient light. The SW1 is switched to close and open with the clock cycle, the SW2 is switched to open in the first cycle then synchronized with the SW1 in following cycles.

In the first cycle, the SW2 is switched to open, so there is no ambient light calibration analog signal ($V_{ambient\_DAC}$) coupled to the one cycle clock base ADC 112. The ambient light builds an upper bound and a lower bound of the output signal intensity ($V_{ADC}$) of the one cycle clock base ADC 112, i.e. to initiate the sensing range.

From the second cycle, the SW1 and the SW2 are switched synchronously. In duty, the ambient light calibration analog signal ($V_{ambient\_DAC}$) is coupled to the one cycle clock base ADC 112 to gradually calibrate the ambient light interference from the output signal intensity ($V_{ADC}$) till the ambient light calibration analog signal ($V_{ambient\_DAC}$) reaches a stable value. After few cycles, the ambient light interference is cancelled from the output signal intensity ($V_{ADC}$) or the output signal intensity ($V_{ADC}$) reaches the lower bound, and the ambient light calibration signal and the ambient light calibration parameters are generated.

Figure 4:
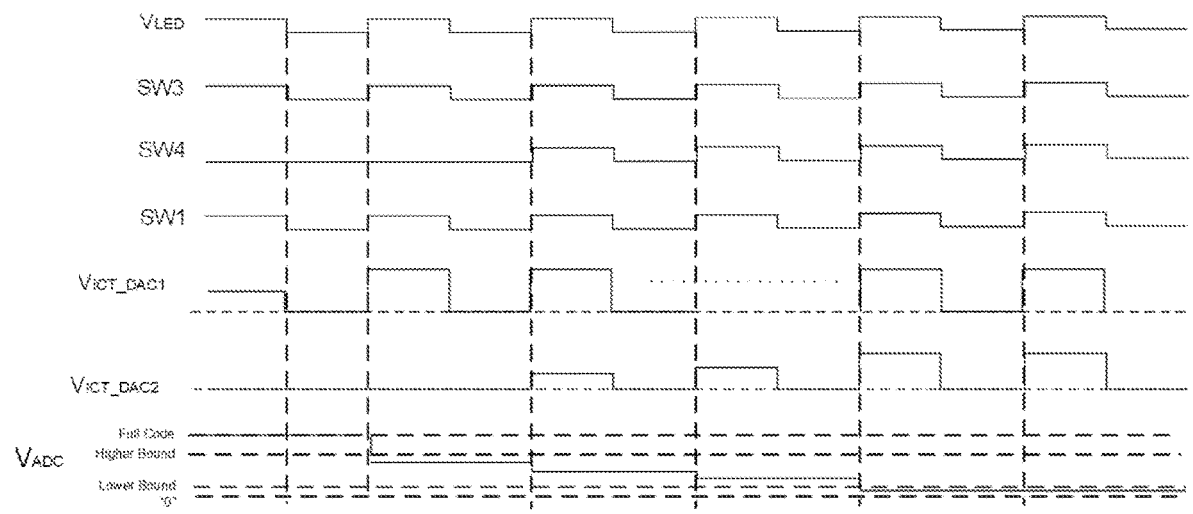
FIG. 4 is a timing diagram of the crosstalk calibration data signal according to an embodiment of the present invention.

FIG. 4 shows methods of generating crosstalk coarse calibration parameters and the crosstalk fine calibration parameters. In the crosstalk calibration stage, the light emitting element 105 is switched to close and open with clock cycle (flashing light), and the light receiving module 106 receives the interference of the ambient light and the crosstalk caused by the reflection of the cover glass, protective film and/or grease on the cover glass.

Below explains the generation method of the crosstalk calibration signal. In this embodiment, the first crosstalk calibration DAC 109 generates the crosstalk coarse calibration signal, and the second crosstalk calibration DAC 110 generates the crosstalk fine calibration signal.

In calibration mode for generating the crosstalk coarse calibration parameter, the SW1 and the SW3 are switched to close and open with clock cycle synchronously. For generating the crosstalk fine calibration parameter, the SW4 is also synchronized with the SW1.

In this embodiment, in the first two cycles, the SW3 and the SW1 are switched to close and open with the clock cycle synchronously but the SW4 is switched to open. From the third cycle, the SW4 is also synchronized with the SW1. It generates the crosstalk coarse calibration parameters first and then the crosstalk fine calibration parameter in few cycles later.

In the first cycle, the one cycle clock base ADC 112 initializes the sensing range, i.e. to build an upper bound and a lower bound of the output signal intensity ($V_{ADC}$). During this period, the ambient light signal, the reflection light of the light emitting module and the first crosstalk calibration analog signal ($V_{ICT\_DAC1}$) generated by the first crosstalk calibration DAC 109 are simultaneously coupled to the one cycle clock base ADC 112.

In the second cycle, the output signal intensity ($V_{ADC}$) is calibrated by the first crosstalk calibration analog signal ($V_{ICT\_DAC1}$) to generate the crosstalk coarse calibration parameter.

In the third cycle, the second crosstalk calibration DAC 110 generates and transmits the crosstalk fine calibration signal ($V_{ICT\_DAC2}$) to the one cycle clock base ADC 112. The crosstalk fine calibration signal ($V_{ICT\_DAC2}$) gradually calibrates the output signal intensity ($V_{ADC}$) to a stable value in several cycles. Then the crosstalk fine calibration parameters are generated.

The coarse calibration parameters and the fine calibration parameters are generated sequentially as described above, and both can be combined as a complete crosstalk calibration parameter. The coarse calibration and the fine calibration can be generated by two circuits in the above embodiment. In another embodiment, the first crosstalk calibration DAC 109 and the second crosstalk calibration DAC 110 are integrated, and the integrated one sequentially generates the crosstalk coarse calibration parameters and the crosstalk fine calibration parameters in several periods.

In summary, the proximity sensing device of the present invention uses a one cycle clock base ADC, combined with calibration circuits of an ambient light and a crosstalk light, to reduce required time of generating calibration parameters without affecting the operation.

What is claimed is:

1. A proximity sensing device, comprising:
a control module;
a light-emitting module comprises a light-emitting element and a driver, the driver is coupled to the light-emitting element and the control module, the driver is driven by the control module to drive the light-emitting element to emit a detection light;
a light receiving module configured to receive and covert an external light to a light sensing signal;
an analog front-end module (AFE) coupled to the light receiving module through a first switch unit (SW1) to receive and convert the light sensing signal to an analog signal;
an analog-to-digital converter (ADC) coupled to the analog front-end module and the control module through a fifth switch unit (SW5) to receive and convert the analog signal to an operation signal to the control module;
a one cycle clock base analog-to-digital converter coupled to the analog front-end module and the control module through a sixth switch unit (SW6) to receive and convert the analog signal to a calibration signal to the control module; and
an ambient light calibration digital-to-analog converter coupled to the light receiving module and the control module through a second switch unit (SW2), wherein
the control module controls the first switch unit, the second switch unit, the fifth switch unit and the sixth switch unit to switch to close or open;
the proximity sensing device enters an operation mode when the fifth switch unit is switched to close and the sixth switch unit is switched to open; and
the proximity sensing device enters a calibration mode when the fifth switch unit is switched to open and the sixth switch unit is switched to close.

2. The proximity sensing device according to claim 1, further comprising a first cross-talk calibration digital-to-analog converter coupled to the light receiving module and the control module through a third switch unit (SW3), wherein the control module controls the third switch unit to switch to close, and the first cross-talk calibration digital-to-analog converter generates and transmits a first crosstalk calibration signal to the light receiving module.

3. The proximity sensing device according to claim 2, wherein the control module controls the first crosstalk calibration digital-to-analog converter to sequentially generate a crosstalk coarse calibration parameter and a crosstalk fine calibration parameter, and then to combine the crosstalk coarse calibration parameter and the crosstalk fine calibration parameter to a crosstalk calibration parameter.

4. The proximity sensing device according to claim 2, further comprising a second crosstalk calibration digital-to-analog converter coupled to the light receiving module and the control module through a fourth switch unit (SW4), wherein the control module controls the fourth switch unit to switch to close, the second crosstalk calibration digital-to-analog converter generates and transmits a second crosstalk calibration signal to the light receiving module.

5. The proximity sensing device according to claim 4, wherein the first crosstalk calibration digital-to-analog converter generates a crosstalk coarse calibration parameter, the second crosstalk calibration digital-to-analog converter generates a crosstalk fine calibration parameter, and the crosstalk coarse calibration parameter and the crosstalk fine calibration parameter can be combined as a crosstalk calibration parameter.

6. The proximity sensing device according to claim 1, wherein the control module comprises a microcontroller, a digital signal processor, and a timing controller, and
when in the calibration mode, the microcontroller receives the calibration signal, generates and records a calibration parameter, converts it into a clock control signal through the digital signal processor, and outputs the clock control signal to the timing controller for controlling switches of the proximity sensing device and the light emitting module; and
when in the operating mode, the microcontroller receives the operating signal and uses the calibration parameter to calibrate the operating signal.

7. The proximity sensing device according to claim 1, wherein the analog front-end module comprises an integrator and a signal amplifier.

8. The proximity sensing device according to claim 1, wherein the one cycle clock base analog-to-digital converter is four-bit.

* * * * *